(12) United States Patent
Potasek

(10) Patent No.: US 10,998,113 B2
(45) Date of Patent: May 4, 2021

(54) REDUNDANT RESISTOR NETWORK

(71) Applicant: Rosemount Aerospace Inc., Burnsville, MN (US)

(72) Inventor: David P. Potasek, Lakeville, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 0 days.

(21) Appl. No.: 16/416,541

(22) Filed: May 20, 2019

(65) Prior Publication Data
US 2020/0373042 A1    Nov. 26, 2020

(51) Int. Cl.
*H01C 1/16*    (2006.01)
(52) U.S. Cl.
CPC ...................... *H01C 1/16* (2013.01)
(58) Field of Classification Search
None
See application file for complete search history.

(56) References Cited

U.S. PATENT DOCUMENTS

| 4,647,906 | A | 3/1987 | Naylor et al. |
| 5,523,712 | A | 6/1996 | Miyabe et al. |
| 5,969,658 | A | 10/1999 | Naylor |
| 7,034,735 | B1 | 4/2006 | Copley |
| 9,374,064 | B1 | 6/2016 | Li |
| 10,310,528 | B1* | 6/2019 | Elsayed ............... G05F 1/575 |
| 2005/0127978 | A1 | 6/2005 | Cranford et al. |
| 2007/0075884 | A1 | 4/2007 | Melanson et al. |
| 2013/0314263 | A1 | 11/2013 | Dix |
| 2014/0340150 | A1* | 11/2014 | Dempsey ............ H03F 1/223 330/260 |
| 2015/0097712 | A1 | 4/2015 | Downey et al. |

OTHER PUBLICATIONS

European Search Report; European Application No. 19210062.6; Filed: Nov. 19, 2019; dated Jun. 9, 2020; 8 pages.

* cited by examiner

*Primary Examiner* — Cassandra F Cox
(74) *Attorney, Agent, or Firm* — Cantor Colburn LLP

(57) ABSTRACT

Provided are embodiments for a resistor array. The resistor array includes a plurality of resistor elements, where the plurality of resistor elements includes a redundancy region for a most significant bit of an expected value. The resistor array also includes one or more switches coupled to the plurality of resistor elements, and a first terminal and a second terminal coupled to the plurality of resistor elements. Also provided are embodiments for trimming the resistor array where the resistor array includes a redundancy region for a most significant bit for an expected value.

19 Claims, 4 Drawing Sheets

REDUNDANT RESISTOR NETWORK

BACKGROUND

The present disclosure is generally related to resistor array circuits and more particularly to redundant resistor networks.

Resistor networks include multiple resistors that can be provided in a known pattern. These resistor networks can be implemented in a variety of configurations and used for various applications. Such applications can include analog-to-digital conversion, digital-to-analog conversion, voltage dividers for power functions, computer applications, and more. There may be a need to improve the accuracy in the tunability of the resistor networks based on its application.

BRIEF DESCRIPTION

According to an embodiment, a resistor array is provided. The resistor array includes a plurality of resistor elements of a resistor array, wherein the plurality of resistor elements include a redundancy region for a most significant bit of an expected value. The resistor array also includes one or more switches coupled to the plurality of resistor elements, and a first terminal and a second terminal coupled to the plurality of resistor elements.

In addition to one or more of the features described herein, or as an alternative, further embodiments include a controller to control switching of the one or more switches.

In addition to one or more of the features described herein, or as an alternative, further embodiments include a redundancy region that is defined by a margin of error for the expected value and overlaps states where a most significant bit (MSB) in an ON state and an OFF state.

In addition to one or more of the features described herein, or as an alternative, further embodiments include a resistor array that includes a subsequent redundancy region for a subsequent MSB.

In addition to one or more of the features described herein, or as an alternative, further embodiments include a resistor element of the plurality of resistor elements that is associated with the MSB is turned ON based at least in part on the expected value.

In addition to one or more of the features described herein, or as an alternative, further embodiments include a resistor element of the plurality of resistor elements that is associated with the MSB is turned OFF based at least in part on the expected value.

In addition to one or more of the features described herein, or as an alternative, further embodiments include a redundancy region in the resistor array for each resistor element that is associated with a significant bit.

In addition to one or more of the features described herein, or as an alternative, further embodiments include selecting each of the plurality of resistor elements based at least in part on the following equation:

$$r_i = A \cdot (2-e)^i$$

where $r_i$ represents an individual resistor element, i represents an index in the resistor array, i=[0:msbi], where MSBi is an index of the most significant bit; 0 represents an index of a least significant bit; A represents a scaling factor which sets a range of the resistor array.

In addition to one or more of the features described herein, or as an alternative, further embodiments include a resistor array that is arranged in at least one of a serial configuration or a parallel configuration.

In addition to one or more of the features described herein, or as an alternative, further embodiments include the one or more switches are irreversible switch.

According to an embodiment, a method for trimming a resistor array is provided. The method includes determining an expected value of a resistor array, the resistor array having resistor elements, wherein the resistor array includes a redundancy region, and measuring values of the resistor elements in the resistor array. The method also includes comparing the measured values to the expected value of the resistor array, determining whether to set a resistor element associated with a most significant bit (MSB) based at least in part on the comparison, wherein the resistor element resides in the redundancy region of the resistor array, and setting the resistor element based on the determination.

In addition to one or more of the features described herein, or as an alternative, further embodiments include controlling the switching of one or more switches coupled to the resistor elements.

In addition to one or more of the features described herein, or as an alternative, further embodiments include a redundancy region that is defined by a margin of error for the expected value and overlaps states where the MSB in an ON state and an OFF state.

In addition to one or more of the features described herein, or as an alternative, further embodiments include re-measuring the resistor array, and setting a next significant bit based on the re-measured value and the expected value of the resistor array.

In addition to one or more of the features described herein, or as an alternative, further embodiments include selectin the plurality of resistor elements based at least in part on the following equation:

$$r_i = A \cdot (2-e)^i$$

where $r_i$, represents an individual resistor element, i represents an index in the resistor array, i=[0:msbi], where MSBi is an index of the most significant bit; 0 represents an index of a least significant bit; A represents a scaling factor which sets a range of the resistor array.

In addition to one or more of the features described herein, or as an alternative, further embodiments include a resistor array that includes a subsequent redundancy region for a subsequent MSB.

In addition to one or more of the features described herein, or as an alternative, further embodiments include a resistor element of the plurality of resistor elements that is associated with the MSB is turned ON based at least in part on the expected value.

In addition to one or more of the features described herein, or as an alternative, further embodiments include a resistor element of the plurality of resistor elements that is associated with the MSB is turned OFF based at least in part on the expected value.

In addition to one or more of the features described herein, or as an alternative, further embodiments include providing a redundancy region in the resistor array for each resistor element that is associated with a significant bit.

In addition to one or more of the features described herein, or as an alternative, further embodiments include a resistor array that is arranged in at least one of a serial configuration or a parallel configuration.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
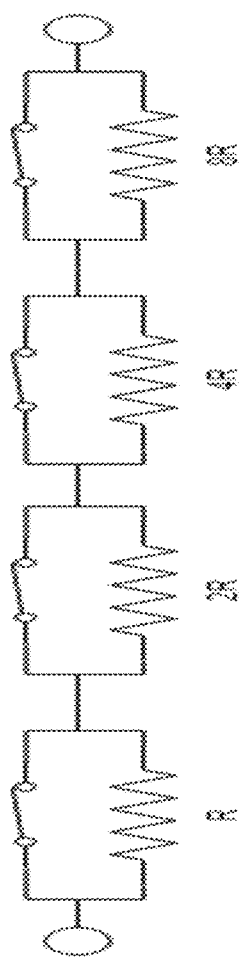
FIG. 1 depicts a resistor network having a series architecture.

Resistor trim arrays are useful for setting precise resistance values for various applications. Resistor trim arrays are generally implemented in a series or parallel resistor configuration with switches that are controlled to activate/deactivate individual resistor elements in the resistor network array. Other implementations also include using fuse-type elements to program the resistance of the resistor network. As shown in FIG. 1 a series configuration is provided and a parallel configuration is provided in FIG. 2. In one or more embodiments, a controller can be used that is configured to control the switching of the switches that are coupled to each of the resistor elements. Traditional resistor network architectures typically have elements that double the prior value such as 1, 2, 4, 8, etc. Resistor network architectures have been known to include many resistor switch combinations to enable the needed range and resolution. For a linear distribution the range=$2^n$*resolution, wherein n is the number of switches in the system. Conventional techniques provide a uniform distribution of possible resistance or conductance settings in the array.

For example, in FIG. 1 the first resistor element has the value R, followed by the second resistor element having the value 2R, and the third and fourth resistor elements having values 4R and 8R, respectively. This provides a uniform distribution of spacing between the resistor elements. That is, any incremental value within the range 1R-17R can be selected using the resistor network. The spacing describes the ability to incrementally increase the value of the trim array using the provided resistor elements. Similarly, the resistor network shown in FIG. 2 includes resistor elements having the values R, 2R, 4R, 8R, and 16R which also provide a uniform conductance distribution between the range 16/(16R) Siemens to −31/(16R) Siemens.

A uniform distribution is often optimal for applications where switches that are coupled to the resistor network can be repeatedly turned ON and OFF. However, a scenario where the switches are replaced with fuse-type structures in which the state settings are fixed, the standard uniform distribution can lead to yield loss because the fixed resistances may be irreversible once a particular resistance value is exceeded.

Figure 2:
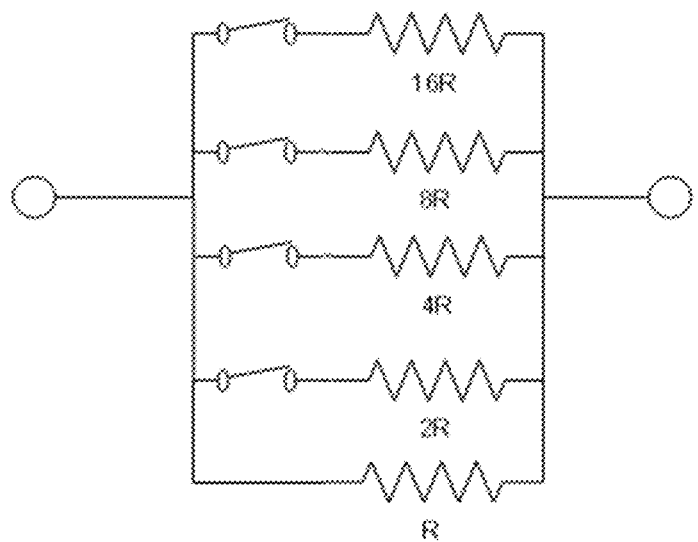
FIG. 2 depicts a resistor network having a parallel architecture.

When the uncertainty margin of an expected output value exceeds the resolution or spacing of the resistor trim array, the precise tunability of the resistor trim array can be lost. In FIGS. 1 and 2, the spacing or resolution between each resistor element is 1R which does not enable a redundancy region in the uniform distribution. By implementing the techniques described herein, redundancy can be built into the resistor trim array by selecting resistor values in accordance with the techniques described below. The redundancy provides an instance where a most significant bit (MSB) (i.e., controls the largest possible change) can be turned ON or OFF in the overlapping region to achieve a desired state of resistance.

By changing the base value, in accordance with the techniques described herein, to a value a redundancy region can be implemented in the resistor trim array to improve the accuracy and tunability of the resistor network. The techniques described herein build redundancy into the resistor network by using resistor elements that follow a particular scheme with a modified base to achieve optimal results by providing multiple ways to achieve the desired resistance state.

With respect to FIGS. 1 and 2, a uniform distribution of resistance values for the resistor elements is shown. The uniform distribution of the spacing of the resistor elements of the resistor network can adhere to the following Equation 1:

$$r_i = A \cdot 2^i \qquad \text{(Eq. 1)}$$

where $r_i$ represents each individual resistor element; i represents the index in the resistor array; i=[0:msbi], where MSBi is the index of the most significant bit; 0 is the index of the least significant bit; and A represents a scaling factor which sets the range of the resistor array.

The values used for the resistor elements used in the techniques described herein are selected to implement a redundant distribution and adhere to the following Equation 2:

$$r_i = A \cdot (2-e)^i \qquad \text{(Eq. 2)}$$

where $r_i$ represents each individual resistor element; i represents the index in the resistor array; i=[0:msbi], where MSBi is the index of the most significant bit; 0 is the index of the least significant bit; A represents a scaling factor which sets the range of the resistor array; and e represents the percentage of redundancy or overlap required for the redundancy region.

The range for the redundancy region can be calculated according to Equation 3:

$$\text{range} = A \cdot \Sigma_{i=0}^{msbi} (2-e)^i \qquad \text{(Eq. 3)}$$

Figure 3:
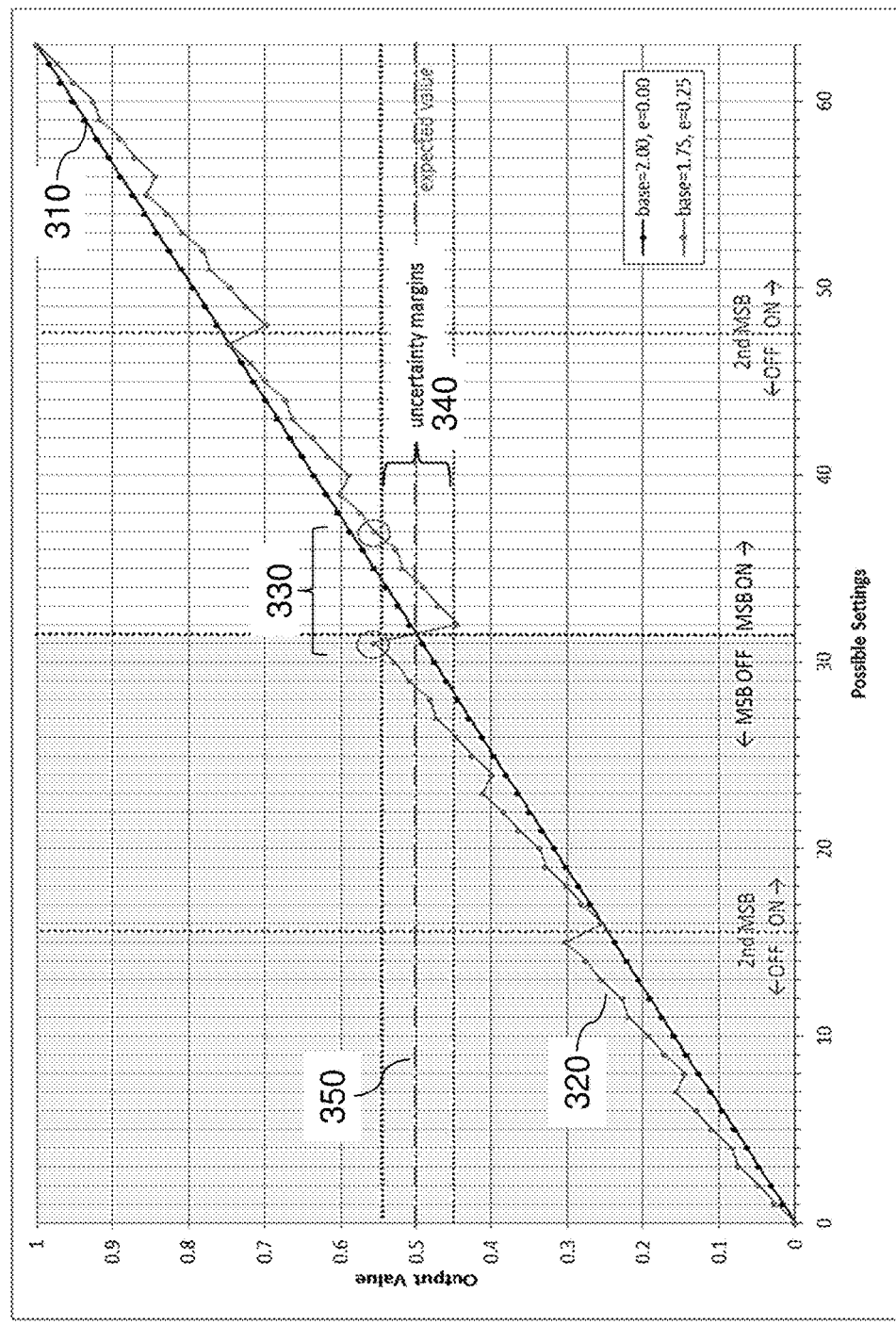
FIG. 3 depicts a graph illustrating the redundancy of the resistor network in accordance with one or more embodiments in accordance with one or more embodiments.

Referring now to FIG. 3, a graph 300 illustrating the redundancy of the resistor array in accordance with one or more embodiments is shown. The graph illustrates the range of possible settings for an example resistor array to achieve an expected output value 350. The graph 300 shown in FIG. 3 also illustrates an issue that occurs when the uncertainty of the expected value exceeds the resolution or spacing of the resistor elements in the resistor trim array. For example, consider the plot 310 shown in FIG. 3 illustrating a uniform distribution where the x-axis represents possible settings for the resistor trim array and the y-axis represents the output value for the resistor trim array.

A first plot 310 provides a standard uniform distribution used to cover the resistor trim array. The first plot 310 does not include a redundancy region. Therefore, the resolution of the uniform distribution will directly impact whether a particular bit is set for the MSB.

Consider an example where the expected value is 50% of the range of the resistor trim array. In this example, the 50% range corresponds to approximately setting 31 for the MSB. It should be understood that other significant bits can be associated with the plot and the resistor elements can be selected in accordance with the techniques described herein. In the event, the margin of error (uncertainty) 340 is ±5% it must be determined whether to set the MSB to the ON state or the OFF state. That is, it is possible for the output value to set the MSB between the values 45-55%. For applications that require precise output values this margin of uncertainty may be too large and unsuitable for its application. In the event a traditional resistor trim array having a uniform distribution of spacing between the resistor values is used, if the incorrect state is selected the trim array will not be able to be used.

A second plot 320 provides the redundancy region 330 in accordance with one or more embodiments. The expected value remains at 50% of the range having a margin of uncertainty that is ±5%. A redundancy region 330 is shown between the possible setting values of 31-36. The MSB can be set to the OFF state and the ON state in the redundancy region 330 hence providing redundancy for the resistor trim array. As shown in the graph 300, the MSB is OFF when less than 31 and the MSB is ON when greater than 31. The redundancy region 330 holds true for each bit where the uncertainty percentage % of the magnitude the particular bit controls is larger than the resolution of the trim array.

The redundancy trim array spacing is well suited when the estimate of the expected value has more uncertainty than the needed final trim resolution. This allows for new measurements and expected values to be generated in between setting trim bits.

Also, in accordance with one or more embodiments, the second most significant bit (MSB) is also shown on the graph of FIG. 3, where the second MSB value includes a corresponding redundancy region. The margin of uncertainty for the second MSB, although by percentage may be similar to the MSB, the value of the error is smaller. This provides an improvement to the tunability and the accuracy of the resistor trim array. The trend of decreasing the magnitude of error continues for each subsequent bit having a redundancy provided in accordance with the techniques described herein.

Figure 4:
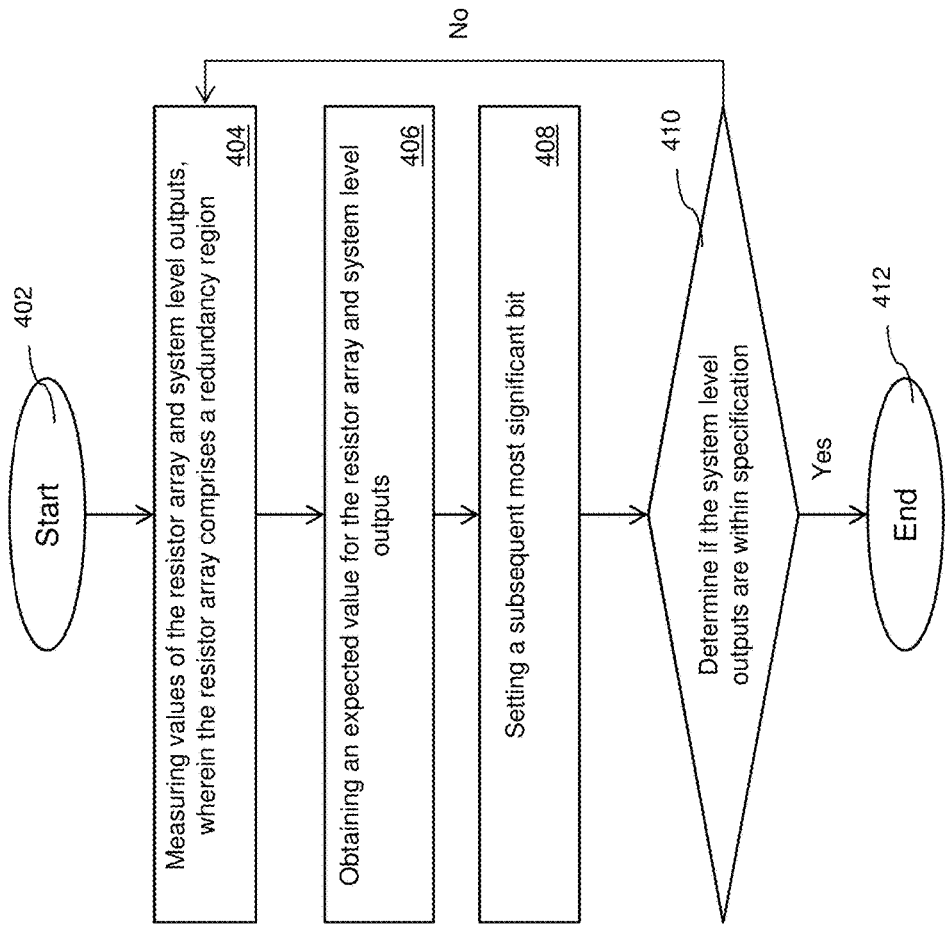
FIG. 4 depicts a flowchart of a method for trimming a resistor array in accordance with one or more embodiments.

Now referring to FIG. 4, a flowchart of a method 400 for trimming a resistor network in accordance with one or more embodiments. The method 400 begins at block 402 and proceeds to block 404 which provides for measuring values of the resistor array and system level outputs, wherein the resistor array comprises a redundancy region. In some embodiments, the trim resistor can be included as part of a voltage divider circuit, where the trim resistor is responsible for adjusting the precise voltage output and the voltage output is the system level output. The trim resistor can be coupled to a fixed gain amplifier and used to precisely set the gain of the amplifier, where the gain is the system level output in this example. In another example, the trim resistor can be used to trim the output of a passive sensor circuit such as but not limited to a Wheatstone bridge. The trim resistor would be used to set the voltage output to the sensor inputs. In addition, the trim resistors can be made out of different materials with different temperature coefficients of resistance to correct for temperature fluctuations of the system level output.

In each scenario above, the desired system level output is a voltage, gain, or sensor characteristic where the output must be precise. The exact resistance values to produce the needed output change are often not known to high precision. Thus, there is a need for an incremental measurement and trimming process such as the method 400 described herein.

In embodiments having complicated circuits with multiple trim resistors contributing to the output, the uncertainty error is magnified even more.

The method 400 proceeds to block 406 and obtains an expected value for the resistor array. The values can be obtained by using known techniques. At block 408, the method 400 sets a subsequent most significant bit in the resistor array. At decision block 410, the method 400 determines if system level outputs are within specifications. The system level outputs can include a voltage, gain, or sensor characteristic that requires a precise output for a particular application. The specification for the system level output can be determined or provided for a particular application. In one or more embodiments, the measured values are compared to the expected value of the resistor array. In an example with reference to FIG. 1, if the expected value that is to result from the resistor array is 8R where the margin of error is known or determined to be 1R through various testing techniques, we must determine whether to set the resistor element 8R associated with the most significant bit. Traditional techniques would automatically set the resistor element associated with the 8R. However, because the margin of error (uncertainty) is 1R the measured outcome can be in the range of 7R and 9R (the combination of resistor elements 1R+8R). By using the techniques described herein, it must be determined whether to set the resistor element 8R to achieve the expected output value of 8R, or alternatively, the resistor element 8R for MSB will not be set and the outcome 7R can be obtained by the combination of resistor elements corresponding to 1R, 2R, and 4R.

In one or more embodiments, the method 400 determines whether to set a resistor element associated with a most significant remaining bit based at least in part on the comparison, wherein the resistor element resides in the redundancy region of the resistor array. By comparing the actual measurement of the array it can be determined either to set the 8R as the MSB or not. The determination can be based by comparing the amount of error between setting the MSB and not setting the MSB and achieving the expected outcome. The combination resulting in the smallest error can be used to select set the resistor element corresponding to the MSB. The redundancy is provided in that multiple combinations can be used to achieve the desired outcome.

By selecting the resistor elements and resistor element values in accordance with the techniques described herein, a redundancy region can be built into the resistor array to improve the error that may result. Returning to decision block 410, if it is determined that the system level outputs are within the desired specification ("No" branch), then the method 400 returns to block 404. Otherwise, the method 400 proceeds to block 412 ("Yes" branch) and ends the process. It is to be understood that a similar technique can be applied to other significant bits after determining whether or not to set the MSB.

The technical effects and benefits include using a redundancy trim array spacing when the estimate of the expected value has more uncertainty than the needed final trim resolution. In addition, the technical effects and benefits include setting the MSB elements to smaller values to achieve a more optimal outcome. This allows for new measurements and expected value to be generated between setting trim bits.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A resistor array comprising:
   a plurality of resistor elements of a resistor array, wherein the plurality of resistor elements include a redundancy region for a most significant bit of an expected value, wherein the redundancy region is defined by a margin of error for the expected value and overlaps states where a most significant bit (MSB) in an ON state and an OFF state;
   one or more switches coupled to the plurality of resistor elements; and
   a first terminal and a second terminal coupled to the plurality of resistor elements.

2. The resistor array of claim 1, further comprising a controller to control switching of the one or more switches.

3. The resistor array of claim 1, wherein the resistor array comprises a subsequent redundancy region for a subsequent MSB.

4. The resistor array of claim 1, wherein a resistor element of the plurality of resistor elements that is associated with the MSB is turned ON based at least in part on the expected value.

5. The resistor array of claim 1, wherein a resistor element of the plurality of resistor elements that is associated with the MSB is turned OFF based at least in part on the expected value.

6. The resistor array of claim 1, further comprising a redundancy region in the resistor array for each resistor element that is associated with a significant bit.

7. The resistor array of claim 1, wherein the plurality of resistor elements are each selected based at least in part on the following equation:

$$r_i = A \cdot (2-e)^i$$

where $r_i$ represents an individual resistor element, i represents an index in the resistor array, i=[0:msbi], where MSBi is an index of the most significant bit; 0 represents an index of a least significant bit; A represents a scaling factor which sets a range of the resistor array.

8. The resistor array of claim 1, wherein the resistor array is arranged in at least one of a serial configuration or a parallel configuration.

9. The resistor array of claim 1, wherein the one or more switches coupled to the plurality of resistor elements are irreversible switches.

10. A method for trimming a resistor array, the method comprising:
    determining an expected value of a resistor array comprising resistor elements, wherein the resistor array comprises a redundancy region;
    measuring values of the resistor elements in the resistor array;
    comparing the measured values to the expected value of the resistor array;
    determining whether to set a resistor element associated with a most significant bit (MSB) based at least in part on the comparison, wherein the resistor element resides in the redundancy region of the resistor array; and
    setting the resistor element based on the determination.

11. The method of claim 10, further comprising controlling switching of one or more switches coupled to the resistor elements.

12. The method of claim 10, wherein the redundancy region is defined by a margin of error for the expected value and overlaps states where the MSB in an ON state and an OFF state.

13. The method of claim 10, further comprising:
    re-measuring the resistor array;
    setting a next significant bit based on the re-measured value and the expected value of the resistor array.

14. The method of claim 10, wherein the plurality of resistor elements are each selected based at least in part on the following equation:

$$r_i = A \cdot (2-e)^i$$

where $r_i$ represents an individual resistor element, i represents an index in the resistor array, i=[0:msbi], where MSBi is an index of the most significant bit; 0 represents an index of a least significant bit; A represents a scaling factor which sets a range of the resistor array.

15. The method of claim 10, wherein the resistor array comprises a subsequent redundancy region for a subsequent MSB.

16. The method of claim 10, wherein a resistor element of the plurality of resistor elements that is associated with the MSB is turned ON based at least in part on the expected value.

17. The method of claim 10, wherein a resistor element of the plurality of resistor elements that is associated with the MSB is turned OFF based at least in part on the expected value.

18. The method of claim 10, further comprising providing a redundancy region in the resistor array for each resistor element that is associated with a significant bit.

19. The method of claim 10, wherein the resistor array is arranged in at least one of a serial configuration or a parallel configuration.

* * * * *